(12) United States Patent
Subramanian

(10) Patent No.: US 6,685,467 B1
(45) Date of Patent: Feb. 3, 2004

(54) SYSTEM USING HOT AND COLD FLUIDS TO HEAT AND COOL PLATE

(75) Inventor: Ramkumar Subramanian, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 275 days.

(21) Appl. No.: 09/709,827

(22) Filed: Nov. 10, 2000

Related U.S. Application Data

(60) Provisional application No. 60/242,817, filed on Oct. 24, 2000.

(51) Int. Cl.$^7$ ................................................ F27D 5/00
(52) U.S. Cl. ........................ 432/253; 427/510; 165/80.1
(58) Field of Search ................................ 432/253, 260; 219/388, 390, 540, 543; 427/510; 118/724, 725, 766; 62/3.3, 3.7; 165/80.1, 80.2, 80.4

(56) References Cited

U.S. PATENT DOCUMENTS

| | | | |
|---|---|---|---|
| 4,361,749 A | * 11/1982 | Lord | ........................ 219/121.4 |
| 5,802,856 A | 9/1998 | Schaper et al. | |
| 5,846,375 A | * 12/1998 | Gilchrist et al. | ........ 156/345.52 |
| 5,983,644 A | 11/1999 | Bolandi et al. | |
| 6,018,616 A | 1/2000 | Schaper | |
| 6,034,771 A | 3/2000 | Rangarajan et al. | ......... 356/450 |
| 6,073,681 A | * 6/2000 | Getchel et al. | ............ 165/80.1 |
| 6,362,116 B1 | 3/2002 | Lansford | ..................... 438/781 |
| 6,394,797 B1 | 5/2002 | Sugaya et al. | .............. 432/253 |
| 6,441,349 B1 | 8/2002 | Rangarajan et al. | ..... 219/444.1 |

* cited by examiner

*Primary Examiner*—Gregory Wilson
(74) *Attorney, Agent, or Firm*—Amin & Turocy, LLP

(57) ABSTRACT

The invention provides systems and methods for controlling resist baking processes, such as PEB of chemically amplified photoresists. A system of the invention provides a baking plate through which hot fluids and cold fluids may be alternately circulated. The system takes measurements relating to temperature of the baking plate, temperature of the resist, and/or extent of the baking process. Using this data, the system controls the baking temperature and/or the overall extent of the baking process through control over the flow of hot and cold fluids. By alternating between hot and cold fluid circulation, systems of the invention provide rapidly responsive temperature control and/or abrupt termination of baking. Control over the baking process is further increased by implementing flow and process control separately over each of a plurality of different portions of a baking plate.

31 Claims, 10 Drawing Sheets

SYSTEM USING HOT AND COLD FLUIDS TO HEAT AND COOL PLATE

CROSS REFERENCE TO RELATED APPLICATIONS

This application claims the benefit of U.S. Provisional Patent Application Ser. No. 60/242,817, filed Oct. 24, 2000, entitled SYSTEM USING HOT AND COLD FLUIDS TO HEAT AND COOL PLATE.

TECHNICAL FIELD

The present invention generally relates to semiconductor processing, and in particular to a system and method for post baking a chemically amplified photoresist.

BACKGROUND OF THE INVENTION

In the semiconductor industry, there is a continuing trend toward higher device densities. To achieve these high densities there have been, and continue to be, efforts toward scaling down device dimensions on semiconductor wafers. In order to accomplish higher device density, smaller and smaller features sizes are required. These may include the width and spacing of interconnecting lines, spacing and diameter of contact holes, and surface geometry of corners and edges of various features.

High resolution lithographic processes are used to achieve small features with close spacing between adjacent features. In general, lithography refers to processes for pattern transfer between various media. Lithography is a technique used for integrated circuit fabrication in which a silicon slice, the wafer, is coated uniformly with a radiation-sensitive film, the resist. The film is selectively exposed with radiation (such as optical light, x-rays, or an electron beam) through an intervening master template, the mask, forming a particular pattern. Areas of the coating exposed through the mask become either more or less soluble (depending on the type of coating) in a particular solvent developer. The more soluble areas are removed in a developing process leaving the less soluble areas in the form of a patterned coating.

Shorter wavelength light, in the 193 to 248 nm range, is presently used to pattern small features. The intensity of common sources for such light, is comparatively low. To keep processing times under control, sensitive photoresists are employed. A typical highly sensitive photoresist is a chemically amplified photoresist. A chemically amplified photoresist is one in which exposure to actinic radiation produces a catalyst for a reaction that alters the solubility of the resist. A common example is a positive tone resist containing a photoacid generator that generates an acid catalyst on exposure to actinic radiation. The photogenerated acid may catalyze a deprotection reaction that increases the solubility of the photoresist in aqueous base.

In the typical case, a post exposure baking (PEB) step is required to cause the photo-generated catalyst to diffuse and react within the photoresist coating. The PEB step has a significant effect on the quality of pattern transfer. If the PEB step is too long or the resist is overheated, the catalyst can migrate outside of the exposed portion of the resist into surrounding unexposed areas. If the PEB step is too short or the resist is underheated, diffusion and reaction of the catalyst may be unduly limited resulting in an inadequate solubility contrast between exposed and unexposed regions of the photoresist. There is an unsatisfied need for systems and methods of effectively controlling PEB of chemically amplified photoresists.

SUMMARY OF THE INVENTION

The invention provides systems and methods for controlling resist baking processes, such as PEB of chemically amplified photoresists. A system of the invention provides a baking plate through which hot fluids and cold fluids may be alternately circulated. The system takes measurements relating to temperature of the baking plate, temperature of the resist, and/or extent of the baking process. Using this data, the system controls the baking temperature and/or the overall extent of the baking process through control over the flow of hot and cold fluids. By alternating between hot and cold fluid circulation, systems of the invention provide rapidly responsive temperature control and/or abrupt termination of baking. Control over the baking process is further increased by implementing flow and process control separately over each of a plurality of different portions of a baking plate.

One aspect of the invention provides a baking system including a baking plate within which are formed passages through which fluids may be circulated, a hot fluid supply, a cold fluid supply, a flow control system, a controller, and a measuring system, wherein the controller, in response to data provided by the measuring system, directs the flow control system to supply the passages with fluid from the hot fluid supply and/or fluid from the cold fluid supply, depending on whether the baking plate needs to be heated or cooled.

Another aspect of the invention provides a baking system including a baking plate within which are formed a plurality of segregated groups of passages, a portion of the baking plate being associated with each of the segregated groups of passages, a hot fluid supply, a cold fluid supply, and a flow control system that independently for a plurality of the segregated groups of passages controls the circulation of fluid from the hot fluid supply and fluid from the cold fluid supply, whereby the plurality of segregated groups of passages may be supplied with either hot or cold fluid and associated portions of the baking plate may be either heated or cooled.

A further aspect of the invention provides method of post baking a chemically amplified photoresist including placing a photoresist coated substrate on a baking plate, circulating hot fluid through the baking plate to heat the photoresist, and then circulating cold fluid through the baking plate to cool the photoresist.

A still further aspect of the invention provides a system for post baking a chemically amplified photoresist coating on a substrate including means for circulating hot and cold fluids through a baking plate and means for controlling the post baking of the chemically amplified photoresist via controlling the circulation of hot and cold fluids through the baking plate.

The invention extends to features hereinafter fully described and particularly pointed out in the claims. The following description and the annexed drawings set forth in detail certain illustrative examples of the invention. These examples are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
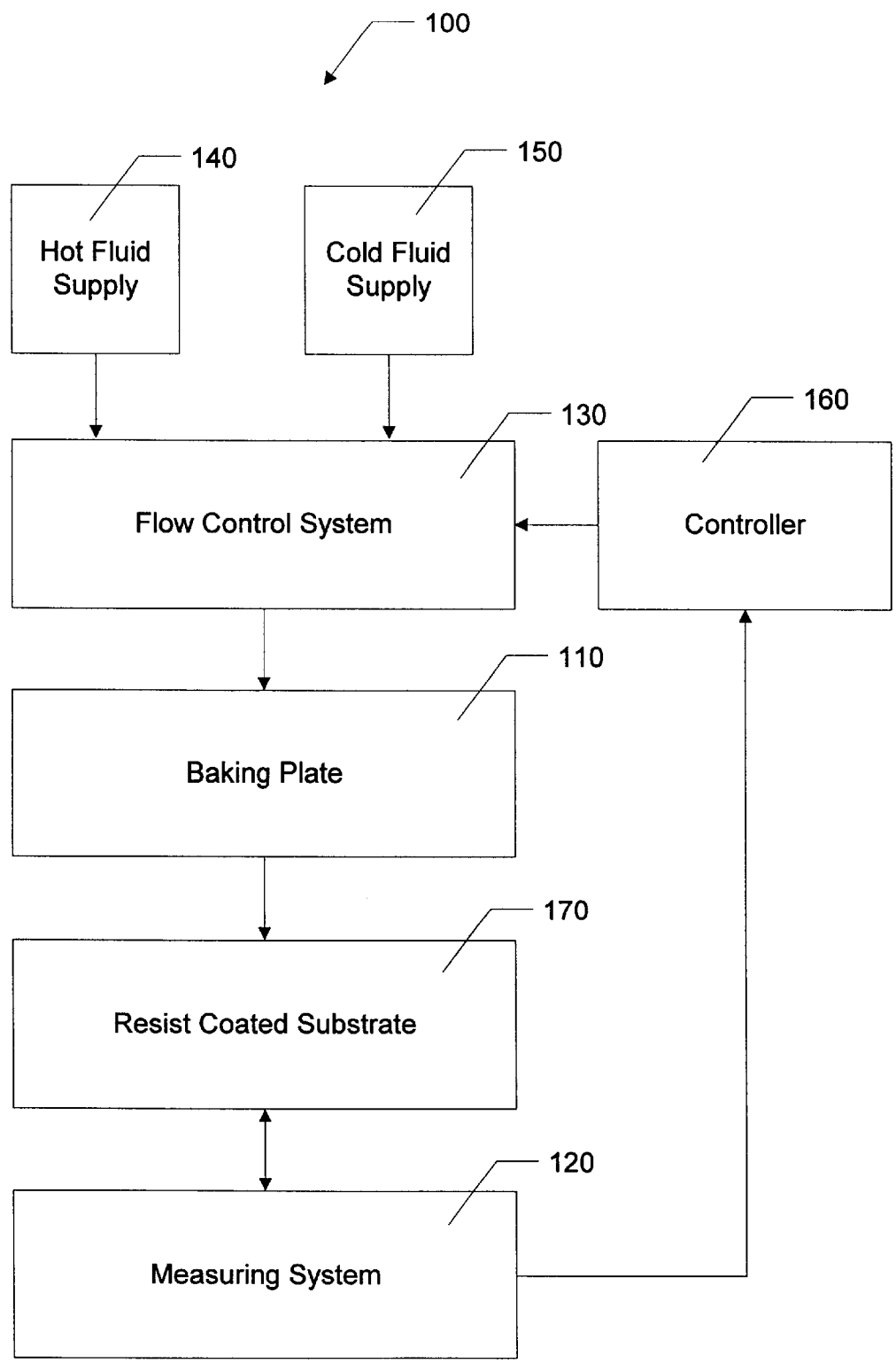
FIG. 1 is a high level schematic of a system according to one aspect of the present invention.

FIG. 1 is a high level schematic of a system 100 according to one aspect of the present invention. System 100 include baking plate 110, measuring system 120, flow control system 130, hot fluid supply 140, cold fluid supply 150, and controller 160. Measuring system 120 obtains data relating to resist coated substrate 170, which is placed on baking plate 110. On the basis of data from measuring system 120, controller 160, via flow control system 130, controls the circulation through baking plate 110 of fluids from hot fluid supply 140 and cold fluid supply 150. By controlling the circulation of hot and cold fluids through baking plate 110, system 100 regulates baking plate temperature, which in turn may regulate resist coating temperature and a resist baking process.

Figure 2:
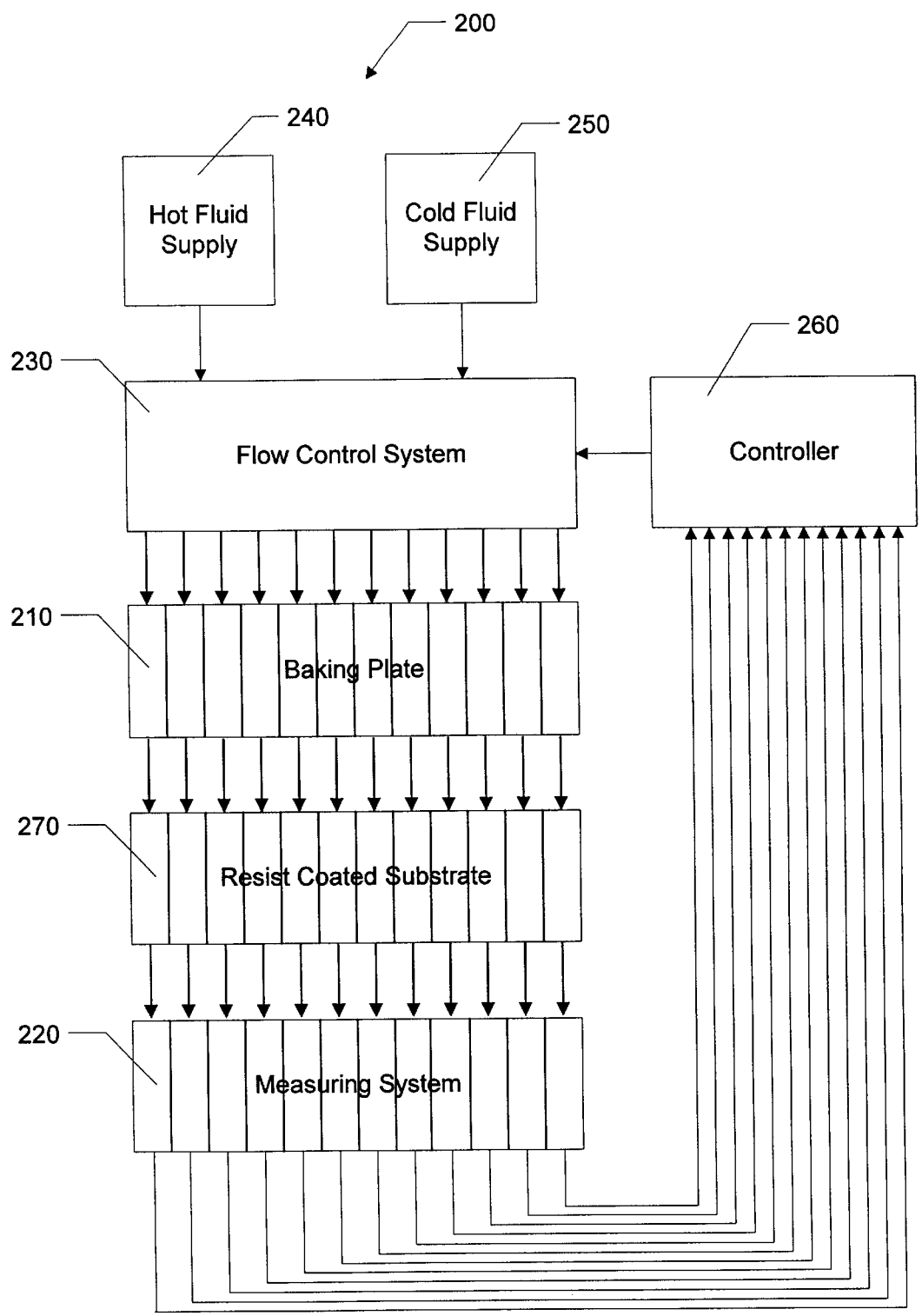
FIG. 2 is a high level schematic of a system according to another aspect of the present invention.

FIG. 2 is a high level schematic of a system 200 according to another aspect of the present invention. System 200 includes baking plate 210, measuring system 220, flow control system 230, hot fluid supply 240, cold fluid supply 250, and controller 260. Measuring system 220 obtains data relating to not just one, but a plurality of regions of resist coated substrate 270, which is placed on baking plate 210. On the basis of data from measuring system 220, controller 260 directs flow control system 230, which separately controls the circulation of fluids from hot fluid supply 240 and cold fluid supply 250 through a plurality of portions of baking plate 210. By separately controlling the circulation of hot and cold fluids through a plurality of portions of baking plate 210, system 200 separately controls the temperature of each of those portions and in turn regulates the resist baking process in corresponding portions of the resist coating on substrate 270.

Baking plates 110 and 210 are permeated with fluid passages. The baking plates are advantageously made of a material with high thermal conductivity, such as a metal, e.g. copper, brass, or aluminum. It is also advantageous if the baking plate has low thermal inertia. Thermal inertia can be made lower by selecting a material with lower specific heat. However, it is generally more practical to lower a plate's thermal inertia by increasing the plate's porosity. Plates of the invention do not have to have high porosity, but in one aspect of the invention, the plate has a porosity of at least about 0.80. In another aspect of the invention, the plate has a porosity of at least about 0.90.

Baking plate porosity is affected by the shape and density of fluid passages. The highest density of circular passages having uniform diameter is achieved with a hexagonal grid arrangement. In such an arrangement, the thicknesses of the walls between passages varies depending on where it is measured. The geometry limits the porosity. Higher porosities may be achieved with passages having hexagonal, triangular, or rectangular cross-section, which in close packed arrangement can be provided with walls having uniform thickness. The porosity of a plate having hexagonal, triangular, or rectangular passages in close packed arrangement is limited only by the strength of the materials used in constructing the plate.

Figure 3:
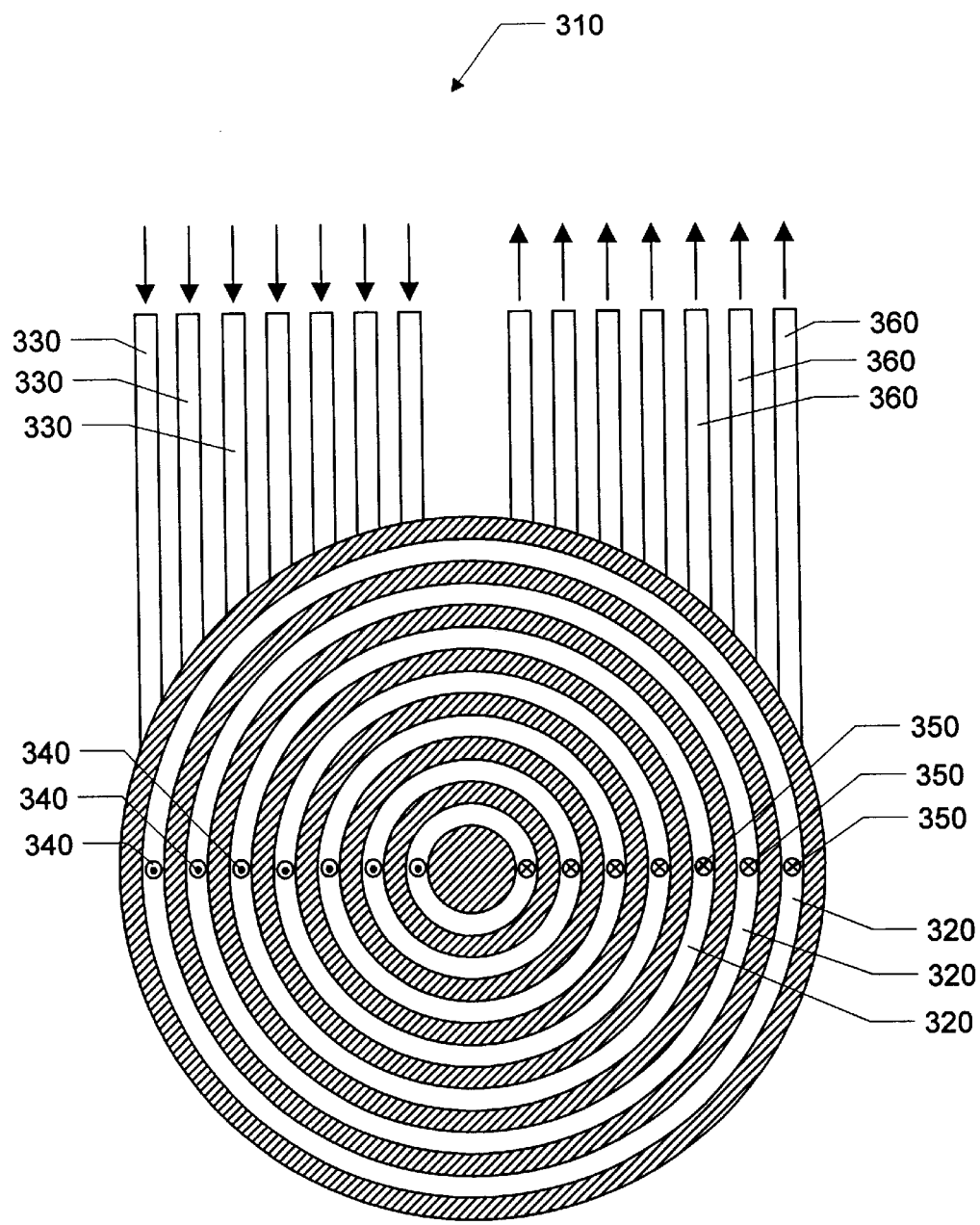
FIG. 3 is an illustration of a baking plate according to one aspect of the invention.

Baking plate 210 has segregated groups of passages through which fluids may be separately circulated. Each segregated group of passages is associated with a different portion of plate 210. FIG. 3 provides as an example plate 310, which has a plurality of groups of passages 320, each group of passages being associated with an annular region of the plate. Fluid enters plate 310 through passages 330 and entrance ports 340, circulates around the plate following either a clockwise or a counterclockwise branch, and leaves the plate through exit ports 350 and exit passages 360.

Figure 4:
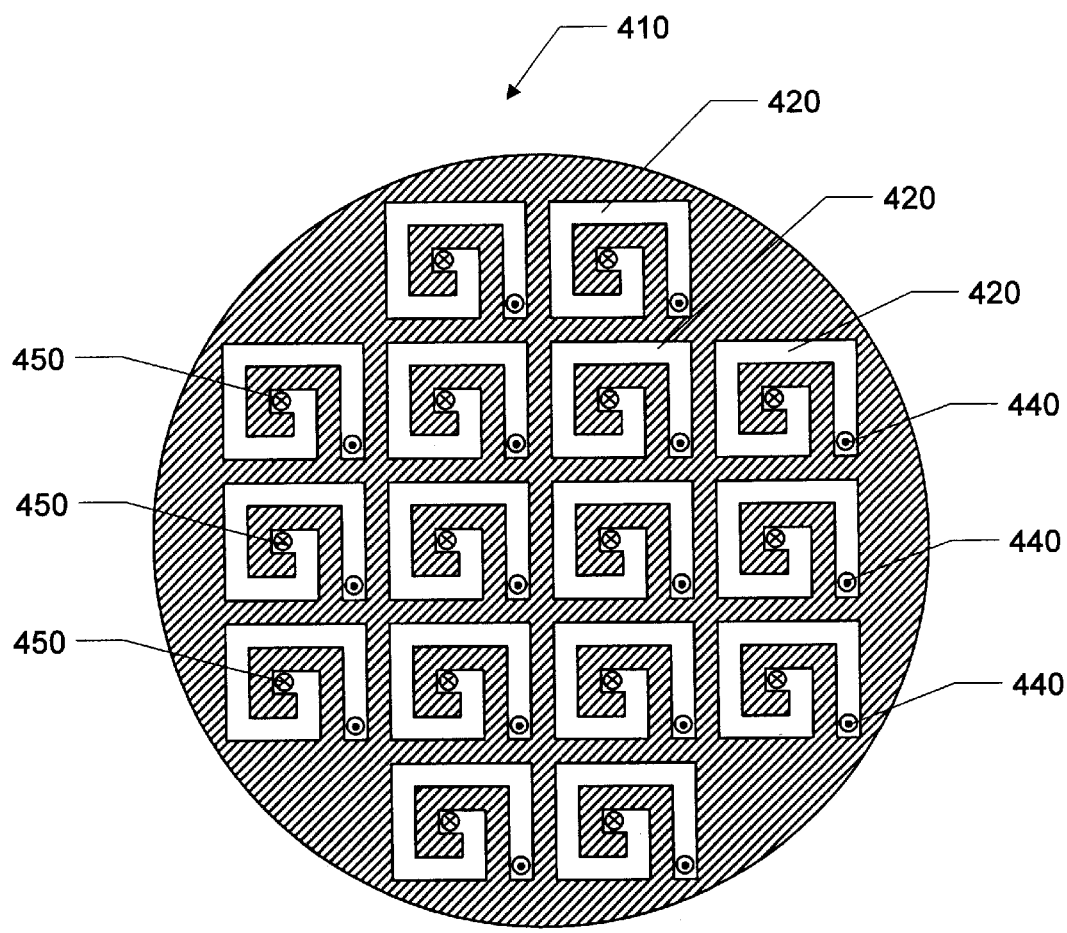
FIG. 4 is an illustration of a baking plate according to another aspect of the invention.

FIG. 4 provides another example, plate 410, which has a plurality of groups of passages 420, each group of passages being associated with a generally square region of plate 410. Fluid enters plate 410 through entrance ports 440, circulates through segregated groups of passages 420, and leaves the plate through exit ports 450. An advantage of plate 410 is that the various regions of plate 410 associated with segregated groups of passages 420 are generally of about the same size, which makes it easier to separately control the temperature of each region through control over the temperature and flow rate of circulating fluids.

Figure 5:
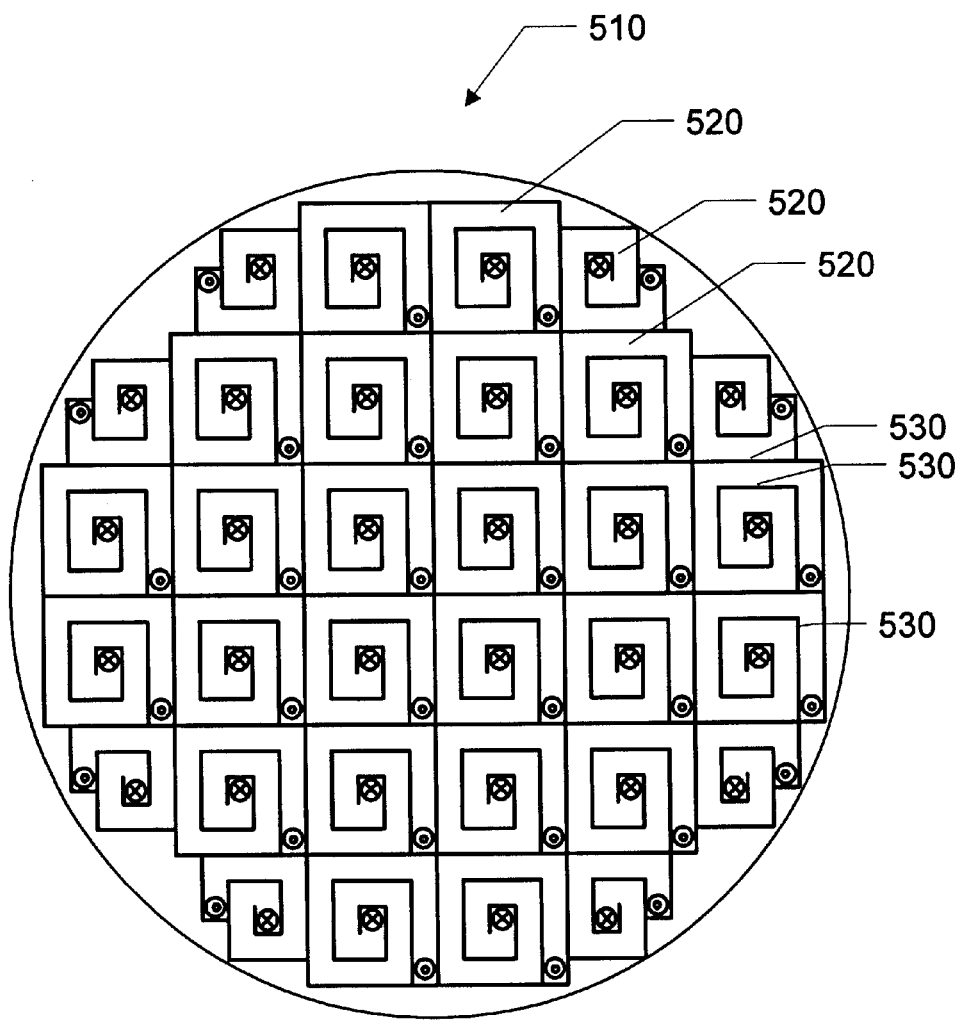
FIG. 5 is an illustration of a baking plate according to a further aspect of the invention.

The passages in FIGS. 3 and 4 have been illustrated for clarity with rather low density, giving the plates relatively low porosities. The designs are readily modified, however, to give high porosity plates. FIG. 5 provides an example of a plate 510 similar to plate 410 of FIG. 4, but having dense passages 520 separated only by thin walls 530. Walls 530 are of uniform thickness and passages 520 have rectangular cross-section.

Flow control system 120 and 220, under the direction of controllers 160 and 260 respectively, control the circulation of hot and cold fluids through the plates. By switching the supply source from hot fluid to cold fluid, flow control systems 120 and 220 can alternately heat and cool baking plates 110 and 210. Optionally, flow control systems 120 and 220 may be configured to mix fluids from hot and cold fluid supplies, whereby the temperature of fluid circulating through the plates may be selected from within the range of temperatures from the hot fluid temperature to the cold fluid temperature. Flow control systems 120 and 220 generally control the overall rate of fluid flow as well as the hot cold mixture, but such control over the overall flow rate is not a necessary: it is sufficient if the system is able to select between hot and cold fluid supplies.

Figure 6:
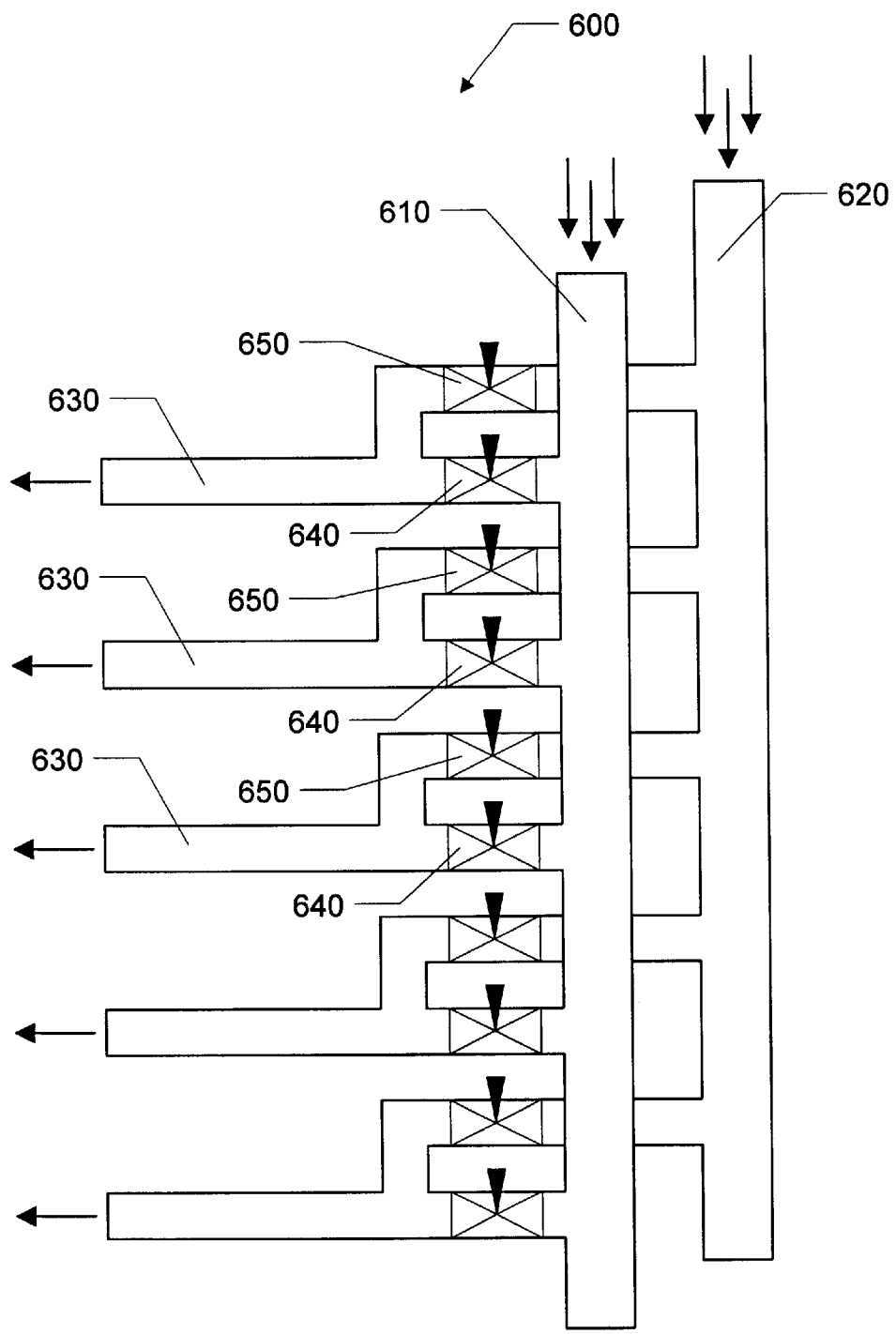
FIG. 6 is an illustration of plumbing for a flow control system according to one aspect of the invention.

FIG. 6 illustrates the plumbing of an example flow control system, 600. Flow control system 600 includes hot fluid manifold 610, which is fed by a hot fluid supply, and cold fluid manifold 620, which is fed by a cold fluid supply. The flow rates of hot fluid into supply lines 630 is controlled by hot fluid valves 640. The flow rates of cold fluid into supply lines 630 is controlled by cold fluid valves 650. Each of hot fluid valves 640 an d cold fluid valves 650 can be separately opened or closed automatically by a controller, which is not illustrated. The valves may be of any suitable type or combination of types. Suitable valves may include ball valves, globe valves, or needle valves. Supplies lines 630 communicate with segregated passages of a baking plate. Flow control system 600 controls the flow rate and hot/cold mix of fluid supplied to each segregated group of passages.

The flow control systems operate under the direction of a controller. Controllers 160 and 260 typically include a microprocessor, but they may be any devices that are capable of operating the flow control systems in response to data from the measuring systems. The controllers may be analog or digital. If the controllers are digital, their instructions may be implemented in either hardware or software.

A measuring system provides the controller with data regarding the baking process. These measurements may be made with respect to a resist coated on a substrate, which is placed on the baking plate, as is the case of measuring systems 120 and 220, or with respect to the temperature of the baking plate. Measurements with respect to a resist coating on a substrate may include resist temperature or data regarding chemical or physical changes taking place in the resist coating as a result of baking. In another aspect of the inventions, the measuring system measures baking plate temperature, or temperatures of a plurality of portion of the baking plate.

Where the measuring system measures baking plate temperature, the system may employ any suitable temperature sensor. Suitable temperature sensors may include a thermocouple, a thermistor, a resistance temperature detector, or a radiation thermometer. Other options include a spectrophotometer or an interferometer, which can be used to detect temperature dependent changes in fluorescence, color, or thermal expansion. Where the temperature measuring system detects the temperature at multiple regions of the plate, multiple temperature sensors may be employed or a single sensor may be employed and scanned over the various regions.

Where the measuring system measures resist temperature, the system generally employs a temperature sensing system that does not contact the resist coating, e.g., a system that employs reflected radiation such as a spectrophotometer or an interferometer to detect temperature dependent changes in fluorescence, color, or thermal expansion. A fluorescent material may be added to the resist to create temperature dependent variations in fluorescence. Suitable materials are substantially inert and do not impede the performance of the resist. Europium chelate is an example of a material suitable for use with many resist coatings.

Figure 7:
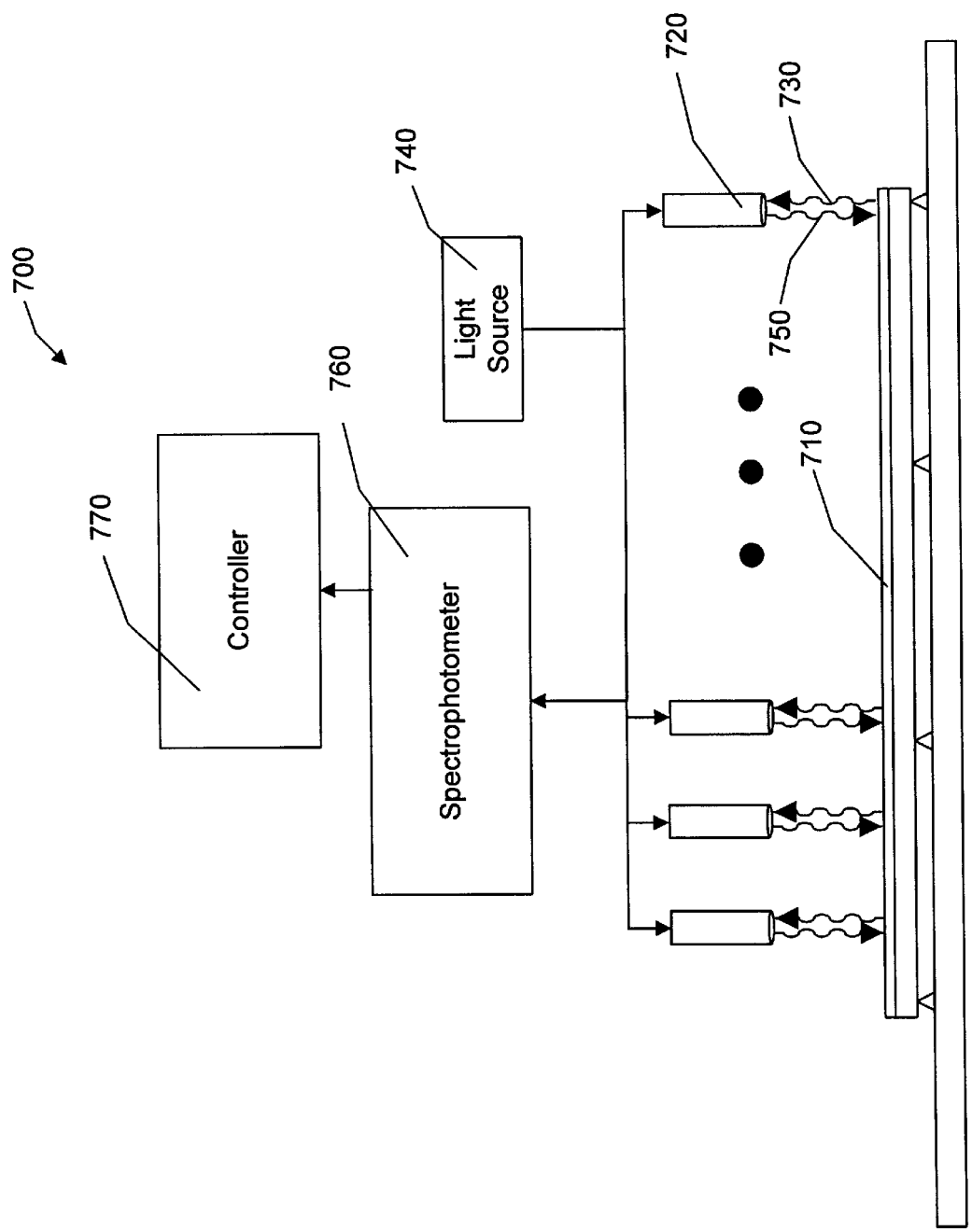
FIG. 7 is an schematic of a resist temperature measuring system according to one aspect of the invention.

FIG. 7 illustrates a system 700 that is configured to measure color of a resist or similar material 710 at a plurality of locations. Optical fibers 720 direct radiation 730 from light source 740 onto the surface of resist 710. The color of the reflected radiation 750 varies in accordance with the temperature of the resist 710. The spectrophotometer 760 collects the reflected radiation 750 and processes it in accordance with spectrometry techniques to provide controller 770 with data corresponding to the color of the photoresist 710. Controller 770 analyzes the data and determines the temperature of photoresist 710.

Instead of, or in addition to, measuring temperature of a resist or of the baking plate, the measuring system may measure the progress of chemical or physical processes, such as reaction and diffusion, within the resist. In one aspect of the invention, the measuring systems measures latent image line width. In another aspect of the invention, the extent of reaction and diffusion in a resist coating is determined by monitoring gaseous reaction byproducts released from the resist coating.

Latent image line width may be measured by any technique that may be applied in situ. Such techniques include optical microscopy, electron microscopy, electron line width measurement, and/or scanning force microscopy. A tracer compound that undergoes a reaction whose progress parallels the progress of a solubility-altering protection or de-protection reaction may be added to the resist to facilitate measurement of the latent image width.

Extent of reaction and/or diffusion may be measured, for example, through analysis of gaseous reaction byproducts. The byproducts may be of a protection or a de-protection reaction that alters the solubility of the resist. On the other hand, the byproducts could be of a reaction between a photo-generated catalyst and a neutralizing compound, such as a reaction between a photo-generated acid and a base dispersed within the resist coating, the extent of the acid/base reaction depending on the extent of diffusion of the acid. Alternatively, the system may detect radiation emitted by reaction of a photo-generated catalyst. Optionally, a tracer compound may be added to the resist, such as one that undergoes a fluorescence producing reaction with a photo-generated catalyst that may be monitored with a spectrophotometer or an optical microscope.

Figure 8:
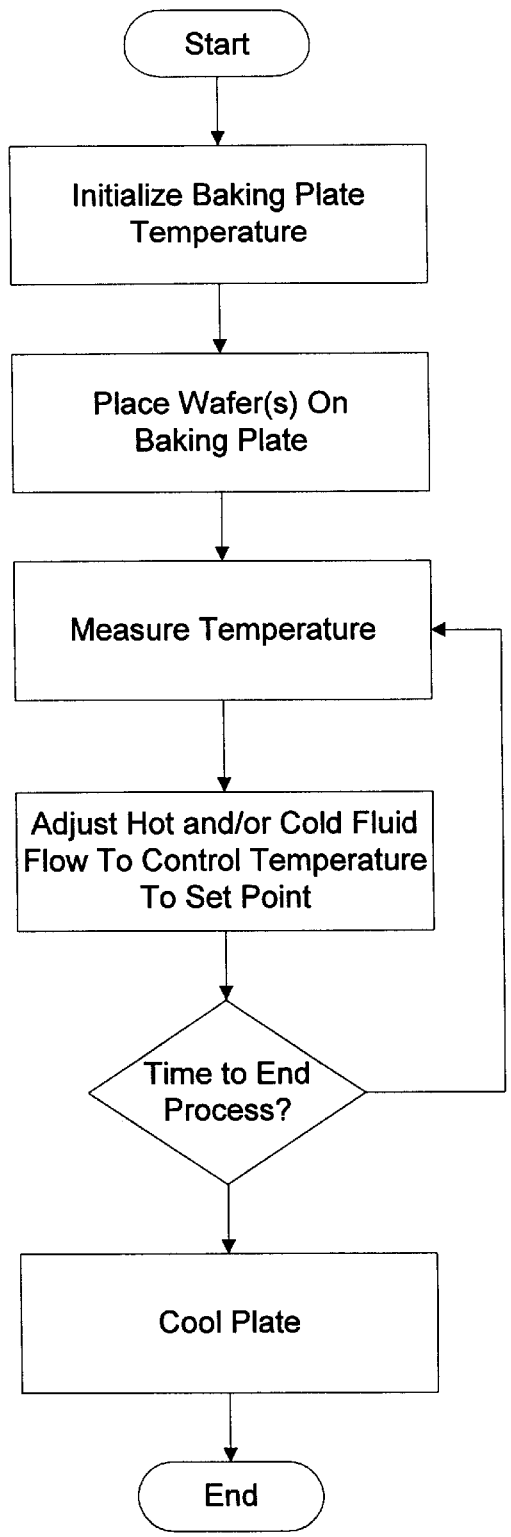
FIG. 8 is a flow diagram of a process according to one aspect of the invention.

FIG. 8 illustrate a process of the invention using feedback control over baking plate temperature. The first step is to initialize the baking plate temperature. The initial temperature may be, for example, room temperature, the cold fluid temperature, or the hot fluid temperature. Generally, the process is easier to control if the initial temperature is room temperature or cooler.

Next the substrate is placed on the baking plate. The substrate may be supported over the baking plate on pins to prevent contamination of the substrate by the plate. On the other hand, placing the substrate directly on the plate improves heat transfer and may allow more precise process control.

Temperature monitoring and control then begin. The bake plate temperature may be measured or the resist temperature. Temperature measurements and process control may involve the entire substrate or may be carried out separately for a plurality of regions of the substrate. After a temperature is measured, a control algorithm determines whether fluid flow rate or hot/cold fluid mixture needs to be adjusted. The control system may adjust only fluid flow rate (either all hot or all cold) or only hot/cold fluid mixture, or it may adjust both flow rate and hot/cold mixture. Any suitable control algorithm may be used. For example, the control algorithm may be a standard proportional-integral-differential (PID) control algorithm.

In the example of FIG. 8, the process ends after a fixed period of time. When it is time to end the process, cold fluid flow is initiated to cool the baking plate, or a particular region of the baking plate. Process termination may begin a little before the baking process is complete to allow for some baking to occur during the cooling process. However, using cold fluid flow, it is generally possible to terminate the baking process so rapidly that significant baking does not take place during the cooling process.

Figure 9:
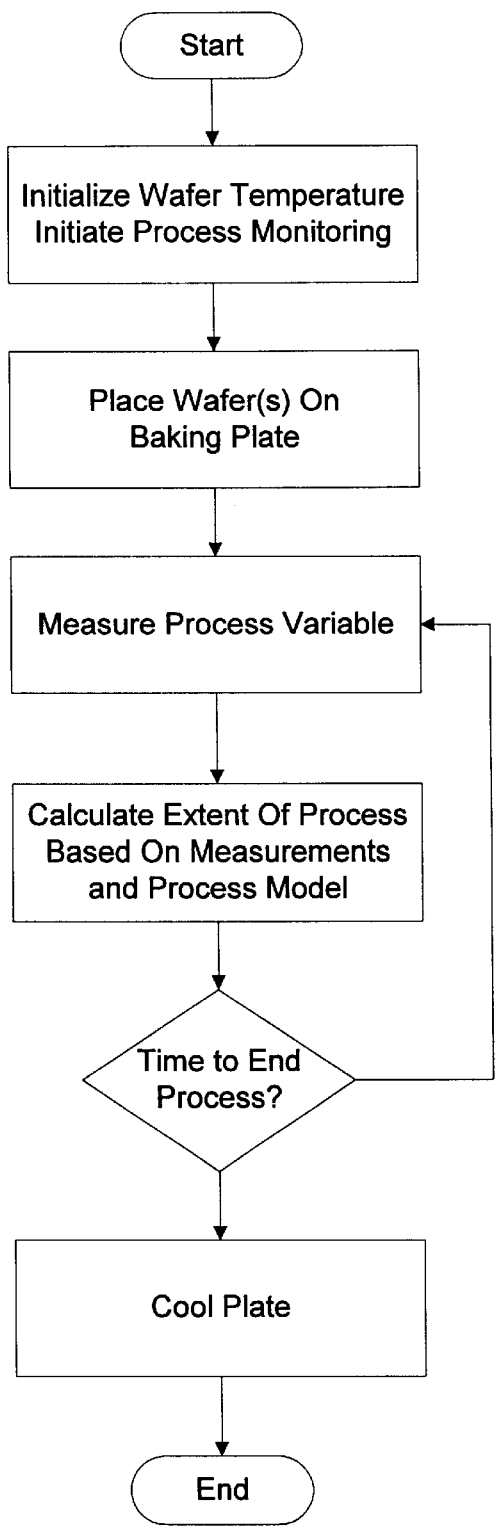
FIG. 9 is a flow diagram of a process according to another aspect of the invention.

Another process of the invention, one using feed forward control over the baking process, is illustrated in FIG. 9. In this example, a process variable is measured that is indicative of the rate of the process. Most typically, this is a temperature, the baking plate temperature or the resist temperature. Baking plate temperature measurement is easier to implement, but resist temperature measurement is more accurate. One temperature may be measured for the entire resist coated substrate, or a plurality of temperatures corresponding to various regions of the resist may be measured. The temperature may be the subject of feedback control as illustrated in FIG. 8, but feedback control over the temperature is not required in the process of FIG. 9.

In the process of FIG. 9, temperature measurements are applied to a process model to determine whether it is time to terminate the baking process. Any suitable model may be used, including empirical, semi-empirical, and theoretical models. The process model takes into a account the effect of temperature on progress of the baking process. Using temperature measurements and elapsed time, the model estimates the extent of the baking process. It is useful to build the model using experimental data obtained under laboratory conditions and to adjust model parameters based on results obtained in production use. When the model determines the process is complete, or very nearly complete, cold fluid flow is initiated to rapidly terminate the baking process. The model is advantageously applied separately to a plurality of regions of the plate subject to segregated flows of hot and cold fluids, thereby the progress of baking in the separate regions of the resist may be independently terminated based on the individual temperature history of that region.

Figure 10:
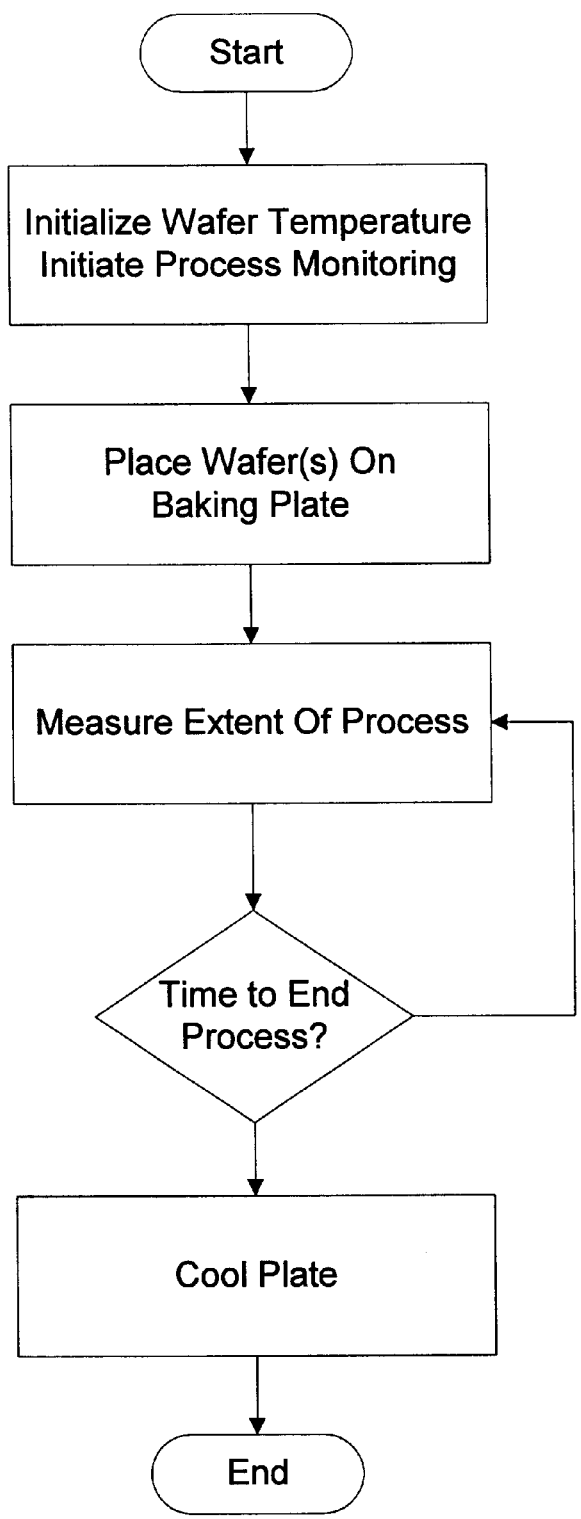
FIG. 10 is a flow diagram of a process according to a further aspect of the invention.

Another process of the invention, one using feedback control over the baking process, is illustrated in FIG. 10. While feedback control over the temperature is optionally applied in this process, a distinguishing feature of the process of FIG. 10 is that it directly measures the extent of the baking process and makes a decision to terminate the process based on that direct measurement. The direct measurement may be of a critical dimension of a latent image within the resist coating. When the process is determined to be complete, or very nearly complete, cold fluid flow may be initiated to terminate the baking process.

The processes of the invention may be applied to pre-exposure or post-exposure resist baking. The resist coating may be of virtually any type. It may be organic or inorganic, positive or negative tone, polymeric or non-polymeric. The resist may be a photoresist responsive to visible light, ultraviolet light, or x-rays, or the resist may be an electron beam resist or an ion beam resist. The resist may be chemically amplified. Resists are commercially available from a number of sources, including Shipley Company, Kodak, Hoechst Celanese Corporation, Clariant, JSR Microelectronics, Hunt, Arch Chemical, Aquamer, and Brewer. Specific examples of resist coatings include novalacs, poly-t-butoxycarbonyloxystyrenes (PBOCOS), poly-methylmethacrylates (PMMA), poly(olephin sulfones) (POS), and poly(methyl isophenyl ketones) (PMIPK).

The substrate on which the resist is coated may also be of virtually any type. Typically, the substrate is a semi-conducting material, such as silicon. In addition to a semi-conducting material, the substrate may include various elements and/or layers; including metal layers, barrier layers, dielectric layers, device structures, active elements and passive elements including silicon gates, word lines, source regions, drain regions, bit lines, bases emitters, collectors, conductive lines, conductive plugs, etc.

The resist coating may be formed on the substrate surface by any suitable means. Spin coating, dip coating, or vapor deposition may be used, depending on the coating material. For example, a 157 nm sensitive photoresist, a 193 nm sensitive photoresist, an I-line, H-line, G-line, E-line, mid UV, deep UV, or extreme UV photoresist may be spin-coated on the substrate surface. Prior to exposure, resist coatings are often "soft-baked" to drive off solvent, improve adhesion of the resist to the substrate, and anneal stresses caused by shear forces encountered in the spinning process. The systems and methods of the invention are suitable for use in these soft-baking processes.

What has been described above is the present invention and several of its specific embodiments. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A baking system, comprising:
 a baking plate within which are formed passages through which fluids maybe circulated;
 a hot fluid supply and a cold fluid supply;
 a flow control system;
 a controller; and
 a measuring system that measures chemical and/or physical changes in a resist coating on a substrate on the baking plate;
 wherein the controller, in response to data provided by the measuring system, directs the flow control system to supply the passages with fluid from the hot fluid supply and/or fluid from the cold fluid supply, depending on whether the baking plate needs to be heated or cooled.

2. The baking system of claim 1, wherein the measuring system measures baking plate temperature.

3. The baking system of claim 1, wherein the measuring system measures the temperature of a resist coating On a substrate on the baking plate.

4. The baking system of claim 3, wherein the controller provides feedback control over the measured temperature.

5. The baking system of claim 3, wherein the controller uses the temperature measurements to estimate when a resist baking process is complete.

6. The baking system of claim 1, wherein the controller cools the baking plate when a measurement from the measuring system indicate a resist baking process is complete or nearly complete.

7. The baking system of claim 1, wherein the measuring system measures a line width for an image latent in the resist coating.

8. The baking system of claim 1, wherein the measuring system analyzes gases released from the resist coating.

9. The system of claim 1, wherein the baking plate has a porosity of at least about 0.80.

10. The system of claim 1, wherein the passages have rectangular cross-section.

11. A baking system, comprising:
 baking plate within which are formed a plurality of segregated groups of passages, a portion of the baking plate being associated with each of the segregated groups of passages;
 a hot fluid supply;
 a cold fluid supply;
 a flow control system that independently for a plurality of the segregated groups of passages controls the circulation of fluid from the hot fluid supply and fluid from the cold fluid supply, whereby the plurality of segregated groups of passages may be supplied with hot and/or cold fluid and associated portions of the baking plate may be either heated or cooled; and
 a measuring system that measures chemical and or physical changes in a plurality of portions of a resist coating on a substrate on the baking plate.

12. The baking system of claim 11, farther comprising:

a controller;

wherein the controller, in response to data from the measuring system and independently for a plurality of the segregated groups of passages, directs the flow control system to supply the segregated groups of passages with fluid from the hot fluid supply and/or fluid from the cold fluid supply, depending on whether the controller determines the associated portions of the baking plate need to be heated or cooled.

13. The baking system of claim 12, wherein the measuring system measures the temperatures of a plurality of portions of the baking plate.

14. The baking system of claim 12, wherein the measuring system measures the temperature of a plurality of portions of a resist coating on a substrate on the baking plate.

15. The baking system of claim 14, wherein the controller provides feedback control over the measured temperatures.

16. The baking system of claim 14, wherein the controller uses the measured temperatures to estimate, for associated portions of the baking plate, when a baking process is complete for an associated portion of the resist coating.

17. The system of claim 12, wherein the baking plate has a porosity of at least about 0.80.

18. The system of claim 12, wherein the passages have rectangular cross-section.

19. The baking system of claim 11, wherein the controller cools a portion of the baking plate when a measurement from the measuring system indicate the baking process in the associated portion of the resist coating is complete or nearly complete.

20. The baking system of claim 11, wherein the measuring system measures line widths for an image latent in the resist coating.

21. The baking system of claim 11, wherein the measuring system analyzes gases released from the resist coating during a baking process.

22. A method of post baking a chemically amplified photoresist, comprising:

placing a photoresist coated substrate on a baking plate;

using a hot fluid supply to circulate hot fluid through the baking plate to heat the photoresist;

using a cold fluid supply to circulate cold fluid through the baking plate to cool the photoresist;

using a controller to control the flow of hot fluid and/or cold depending on whether the baking plate needs to be heated or cooled; and employing a measuring system to measure chemical and/or physical changes in a plurality of portions of a resist coating on the substrate.

23. The method of claim 22, further comprising:

monitoring the progress of the post baking process and circulating the cold fluid only when the post baking process has proceeded to a satisfactory extent.

24. The method of claim 23, wherein monitoring the progress of the post baking process comprises monitoring a dimension of an image latent within the photoresist.

25. The method of claim 23, wherein monitoring the progress of the post baking process comprises monitoring the extent of a chemical reaction within the photoresist.

26. The method of claim 22, wherein:

the baking plate has formed within it a plurality of segregated passages through which fluids may be separately circulated a portion of the baking plate being associated with each group of segregated passages;

the hot and cold fluids are circulated through each group of passages; and the circulation of hot and cold fluids is separately controlled for each of a plurality of the group of segregated passages.

27. The method of claim 26, wherein the circulation of hot and cold fluids is controlled based on temperature measurements.

28. The method of claim 27, wherein the temperature measurements are taken from portions of the baking plate.

29. The method of claim 27, wherein the temperature measurements are taken from portions of the photoresist.

30. A system for post baking a chemically amplified photoresist coating on a substrate, comprising:

means for circulating hot and cold fluids through a baking plate;

means for controlling the post baking of the chemically amplified photoresist via controlling the circulation of at least one of hot and cold fluids through at least one passage within the baking plate; and means for measuring chemical and/or physical changes in a plurality of portions of a resist coating on the substrate.

31. The system of claim 30, wherein:

the means for circulating hot and cold fluids through the baking plate comprises means for circulating hot and cold fluids through a plurality of segregated groups of passages within the baking plate; and the means for controlling the post baking of the chemically amplified photoresist comprises means for separately controlling the circulation of hot and cold fluids through each of a plurality of the segregated groups of passages within the baking plate.

* * * * *

UNITED STATES PATENT AND TRADEMARK OFFICE
CERTIFICATE OF CORRECTION

PATENT NO. : 6,685,467 B1
DATED : February 3, 2004
INVENTOR(S) : Ramkumar Subramanian It is certified that error appears in the above-identified patent and that said Letters Patent is hereby corrected as shown below:

Column 1,
Line 28, replace "High resolution" with -- High-resolution --
Line 44, delete the comma after the word "light"
Line 62, replace "underheated" with -- under heated --

Column 3,
Line 10, replace "an" with -- a --

Column 4,
Line 1, replace "thicknesses" with -- thickness --
Lines 60 and 62, replace "is" with -- are --
Line 63, replace "an d cold" with -- and cold --

Column 5,
Line 61, replace "systems" with -- system --

Column 6,
Line 22, replace "illustrate" with -- illustrates --

Column 7,
Line 8, replace "into a account" with -- into account --
Line 19, replace "fluids, thereby" with -- fluids; thereby --

Column 8,
Line 31, replace "On" with -- on --

Signed and Sealed this

Twenty-fifth Day of May, 2004

JON W. DUDAS
*Acting Director of the United States Patent and Trademark Office*